(12) United States Patent
Watanabe

(10) Patent No.: US 6,377,199 B1
(45) Date of Patent: Apr. 23, 2002

(54) SIGNAL PROCESSOR SYSTEM WITH NOISE SUPPRESSION

(75) Inventor: Tohru Watanabe, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/320,828

(22) Filed: May 26, 1999

(30) Foreign Application Priority Data

May 28, 1998 (JP) ............................................ 10-147395
Mar. 30, 1999 (JP) ............................................ 11-089262

(51) Int. Cl.⁷ .............................................. H03M 1/12
(52) U.S. Cl. ...................................... 341/155; 341/118
(58) Field of Search ................................ 341/143, 155, 341/118

(56) References Cited

U.S. PATENT DOCUMENTS 5,801,652 A * 9/1998 Gong .......................... 341/131

* cited by examiner

*Primary Examiner*—Peguy JeanPierre
(74) *Attorney, Agent, or Firm*—Fish & Richardson P.C.

(57) ABSTRACT

A mixed signal processor includes an analog processor, a digital signal processor, an A/D converter connected between the two processors, a pair of output circuits, and a complementary data generating circuit connected between the output circuits and the digital signal processor. The complementary data generating circuit receives a digital data signal output from the processor and generates a delayed data signal and a complementary signal. The complementary or sub-data signal is generated by inverting the data signal when there is no change between corresponding consecutive bits of the digital signal and maintaining or not inverting the data signal when corresponding consecutive bits of the digital signal are different. The complementary data generating circuit causes a sum of the currents flowing to the respective output circuits to remain constant even when the data bits are changing, which suppresses noise generation which could adversely effect the operation of the analog signal processor.

6 Claims, 6 Drawing Sheets

| n | Da (n) (Main Data) | | | | Number of bit changed | Db (n) (Sub Data) | | | | Number of bit changed |
|---|---|---|---|---|---|---|---|---|---|---|
| 0 | 0 | 0 | 1 | 0 | – | 0 | 0 | 1 | 0 | – |
| 1 | 0 | 1 | 1 | 1 | 2 | 1 | 0 | 0 | 0 | 2 |
| 2 | 1 | 0 | 1 | 1 | 2 | 1 | 0 | 1 | 1 | 2 |
| 3 | 0 | 1 | 0 | 1 | 3 | 1 | 0 | 1 | 0 | 1 |
| 4 | 0 | 1 | 0 | 0 | 1 | 0 | 1 | 0 | 0 | 3 |
| 5 | 0 | 0 | 1 | 1 | 3 | 1 | 1 | 0 | 0 | 1 |
| 6 | 0 | 0 | 1 | 1 | 0 | 0 | 0 | 1 | 1 | 4 |
| 7 | 1 | 0 | 1 | 1 | 1 | 0 | 1 | 0 | 0 | 3 |
| 8 | 1 | 1 | 1 | 1 | 1 | 1 | 1 | 1 | 1 | 3 |
| 9 | 0 | 0 | 0 | 0 | 4 | 1 | 1 | 1 | 1 | 0 |

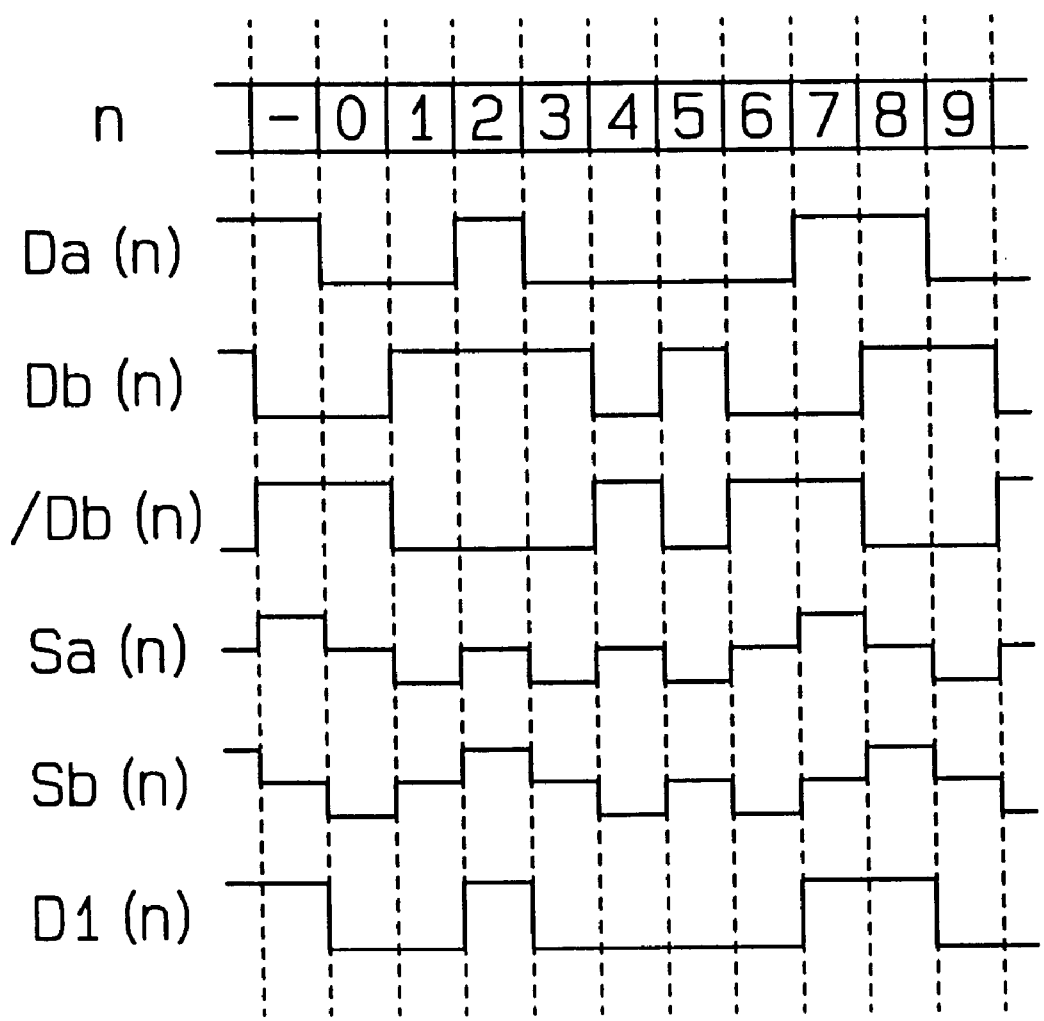

SIGNAL PROCESSOR SYSTEM WITH NOISE SUPPRESSION

BACKGROUND OF THE INVENTION

The invention relates to a signal processing system including both analog and digital processing circuits, and more particularly, to a signal processing system with noise suppression.

Conventional signal processing circuits used for processing an image signal and an aural signal have been analog systems, such processing circuits are now transitioning to digital systems. For example, in an image sensor system, an analog image signal from an image sensor is converted to digital image data via A/D conversion, and is then acted upon by a signal processing circuit.

An image sensor system which employs conventional digital signal processing is shown in FIG. 1. As shown, the system comprises a CCD image sensor 1, a drive circuit 2, a timing control circuit 3, an analog processing circuit 4, an A/D converter 5 and a digital processing circuit 6.

The CCD image sensor 1 includes a plurality of light receiving pixels, not shown, which are disposed in a matrix array on a light responsive surface, and a plurality of shift registers, also not shown, connected to respective light receiving pixels to read an information charge stored therein in a predetermined sequence. A light receiving pixel comprises a photodiode, for example, which produces and stores the information charge in accordance with an image of a photographed object formed on the light responsive surface. Generally, the shift registers include a plurality of vertical transfer shift registers and a single horizontal transfer shift register. Each vertical transfer shift register is aligned with each column of the array of pixels, and the horizontal transfer shift register receives respective outputs from the plurality of vertical transfer shift registers in parallel at its individual stages.

The timing control circuit 3 generates a vertical timing signal VD and a horizontal timing signal HD, which determine the timing of a vertical scan and a horizontal scan, respectively, in accordance with a reference clock signal BCK having a predetermined period. For example, for the NTSC system, the timing control circuit 3 receives the reference clock signal BCK having a frequency of 14.32 MHz, and generates the vertical timing signal VD by a frequency demultiplication of the reference clock signal BCK by a factor of 910 and generates the horizontal timing signal HD by a frequency demultiplication of the vertical timing signal by a factor of 525 combined with a multiplication by a factor of 2. The timing control circuit 3 also controls the operational timings of the circuits 4 to 6 so that their operations are synchronized with the operation of the image sensor 1.

The drive circuit 2 generates a multi-phase vertical transfer clock signal $\phi V$ and a multi-phase horizontal transfer clock signal $\phi H$ in response to the vertical timing signal VD and the horizontal timing signal HD supplied from the timing control circuit 3. The vertical transfer clock signal $\phi V$ is fed to the vertical transfer shift registers in the image sensor 1 simultaneously. Accordingly, the information charge stored in the plurality of pixels in one row is transferred to initial stages of the vertical transfer shift registers and then sequentially shifted from stage to stage in the latter in accordance with the vertical transfer clock signal $\phi V$, and is subsequently transferred from the final stages of the vertical transfer shift registers to the horizontal transfer shift register in accordance with the horizontal timing signal HD. The horizontal transfer clock signal $\phi H$ is fed to the horizontal transfer shift register, whereby the information charge, which is transferred from the vertical to the horizontal transfer shift register, is delivered pixel by pixel in accordance with the horizontal transfer clock signal $\phi H$. As a result, the image information for one frame is delivered from the image sensor 1 to the analog processing circuit 4 in the form of an image signal Y0(t) which is contiguous from row to row.

The analog processing circuit 4 receives the image signal Y0(t), which will be hereafter referred to as the first analog signal, and performs processing, such as sample-and-hold and level clamping operations thereto to form a second analog signal Y1(t) which conforms to a predetermined format. Where the image signal includes an alternation between a reset level and a signal level, the sample-and-hold operation takes place, for example, in a manner such that only the signal level is derived from the first analog signal Y0(t) in synchronism with its delivery from the image sensor 1. During the level clamping operation, the black reference level, which is set at the end of a horizontal scan period for the first analog signal Y0(t), is clamped to a predetermined level for every horizontal scan period.

The A/D converter 5 normalizes the second analog signal Y1(t) received from the analog processing circuit 4 according to the timing of the analog processing circuit 4 or the timing which controls the delivery from the image sensor 1, and produces first digital data D0(n) representing the information corresponding to individual pixels in the image sensor 1. The digital processing circuit 6 receives the first digital data signal D0(n) from the A/D converter 5 and produces second digital data D1(n) containing luminance information and color difference information by performing prescribed operations, such as a color separation and a matrix operation on the first digital data D0(n). For example, during the color separation, the first digital data D0(n) is apportioned according to an array of color filters mounted on the light responsive surface of the image sensor 1, thus producing information representing a plurality of color components. The luminance information is produced by a synthesis of apportioned color components and color difference information is produced by subtracting the luminance information from respective color component information during the matrix operation.

The process of producing color components is little influenced by noise because of the matrix operation. However, processing of analog signals such as an image signal and an aural signal cannot be entirely digitalized, and accordingly, the image sensor system requires both of the analog processing circuit 4 and the digital processing circuit 6. When an integration of both the analog processing circuit 4 and the digital processing circuit 6 on a common semiconductor substrate is implemented, there is a need to suppress the influence of noise, which may be produced in the digital processing circuit 6, upon the analog processing circuit 4. One remedy to guard against noise is for the digital processing circuit 6 to a use Gray code counter instead of a binary counter which is liable to produce noise having a periodicity. It is noted that the Gray code counter has a predetermined number of bits which change from "0" to "1" or from "1" to "0".

When the digital processing circuit 6 is integrated on the same substrate as the analog processing circuit 4, a processed digital signal from the circuit 6 is delivered to an external circuit via an output buffer. The output buffer contains transistors of relatively large sizes in order to drive an external load. Accordingly, as digital data is delivered via the output buffer, it is likely that noises are irregularly produced in response to changes in the output signal. Hence, if the integration of both of the processing circuits 4 and 6 on the common substrated is implemented, such noises may find their way into the analog processing circuit 4 to disturb its signal.

If the analog processing circuit 4 and the digital processing circuit 6 are integrated on separate substrates, when the circuits 4, 6 are operated from a common power supply, noises produced in the digital processing circuit 6 may again find their way into the analog processing circuit 4 via the power supply.

It is an object of the present invention to provide a signal processing system which suppresses noise generated within a digital processing circuit thereof.

SUMMARY OF THE INVENTION

In one aspect of the present invention, a signal processing system includes an analog processing circuit for performing a predetermined signal processing operation on an analog input signal. An A/D converter is connected to the analog signal processing circuit for receiving a processed analog signal from the analog signal processing circuit and for converting the processed analog signal into at least one digital data having at least one bit. A complementary data generating circuit receives the digital data from the A/D converter and produces sub-data containing at least one bit which is mutually complementary to the digital data. The complementary data generating circuit is operative whenever there is a change in at least one bit between consecutive bits of the digital data to maintain the status of a corresponding bit in the sub-data unchanged, and whenever there is no change in at least one bit between consecutive bits of the digital data to invert a corresponding bit in the sub-data. A first output circuit is connected to the complementary data generating circuit for delivering the digital data. A second output circuit is connected to the complementary data generating circuit for delivering the sub-data.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 9 is a timing chart illustrating the operation of the receiver circuit of FIG. 8.

DETAILED DESCRIPTION OF THE PREFERRED EMBODIMENTS

Referring to FIGS. 2 to 5, a signal processing system 10 according to one embodiment of the present invention will now be described.

Figure 2:
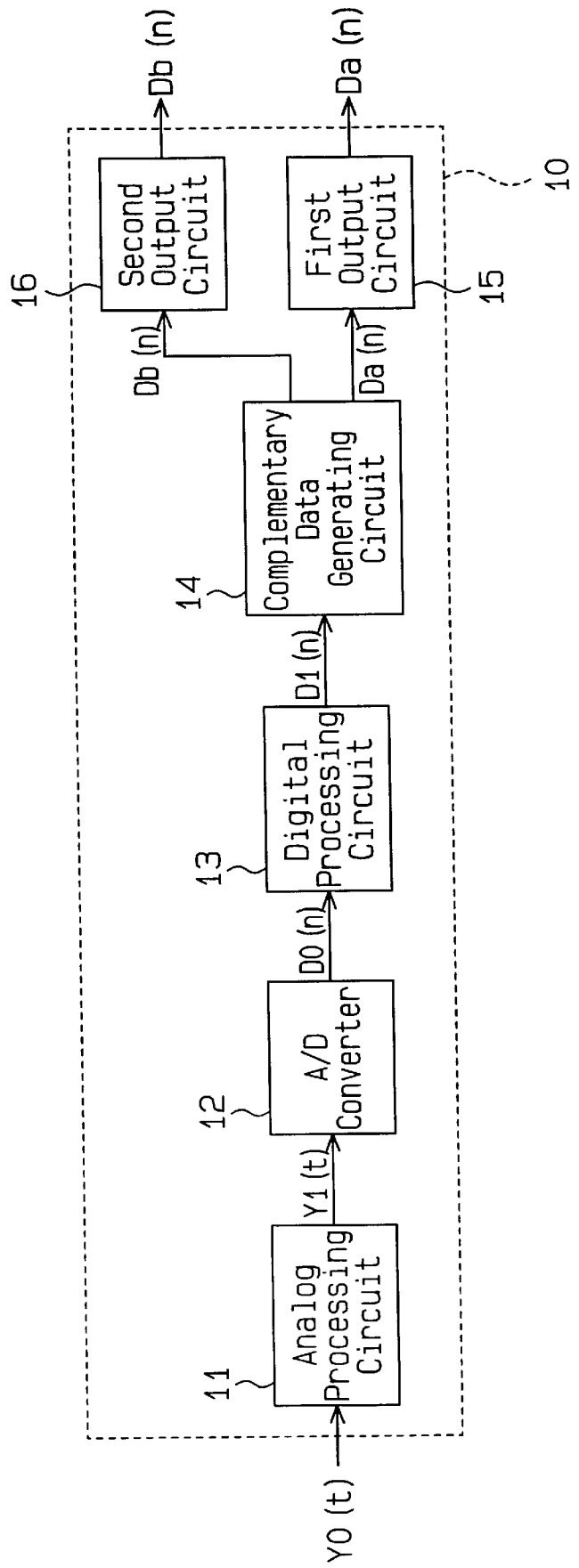
FIG. 2 is a schematic block diagram of a signal processing system according to one embodiment of the present invention.

As shown in FIG. 2, the signal processing system 10 receives a first analog signal Y0(t), produces main data Da(n) and sub-data Db(n) which are complementary to each other and delivers the Da(n) and Db(n) in parallel.

The signal processing system 10 comprises an analog processing circuit 11, an A/D converter 12, a digital processing circuit 13, a complementary data generating circuit 14 and a first output circuit 15 and a second output circuit 16, all of which may be integrated on a common semiconductor substrate, or on separate semiconductor substrates.

Figure 1:
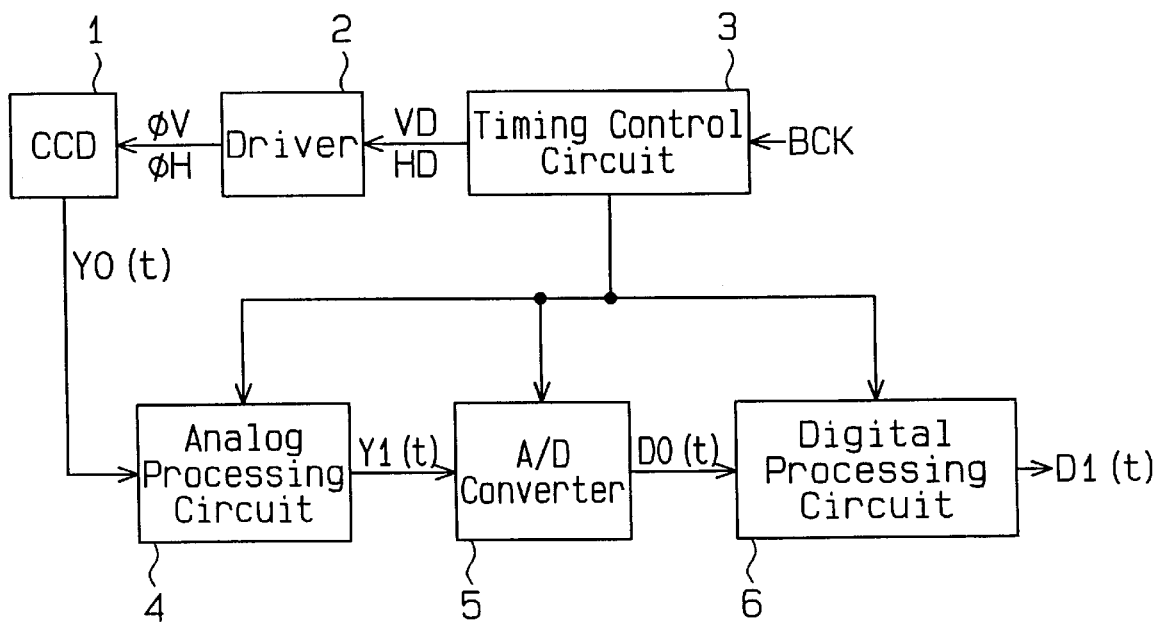
FIG. 1 is a schematic block diagram of a conventional image sensor system.

The analog processing circuit 11, the A/D converter 12 and the digital processing circuit 13 are constructed in an identical manner with the analog processing circuit 4, the A/D converter 5 and the digital processing circuit 6 shown in FIG. 1, and operate in the same manner as mentioned previously. Specifically, the analog processing circuit 11 receives the first analog signal Y0(t) and produces a second analog signal Y1(t). The A/D converter 12 receives the second analog signal Y1(t) and produces first digital data D0(n). The A/D converter 12 samples the second analog signal Y1(t) at a predetermined interval, and converts each of the samples to digital data having a suitable number of bits. The digital processing circuit 13 receives the first digital data D0(n) and produces second digital data D1(n).

The complementary data generating circuit 14 delays the second digital data D1(n) by a predetermined time interval to form the main data Da(n) having a plurality of bits. The complementary data generating circuit 14 also forms the sub-data Db(n) in accordance with the status or value of each bit in the main data Da(n), and delivers the sub-data Db(n) at about the same timing as the main data Da(n). Specifically, the complementary data generating circuit 14 maintains each sub-data bit Db(n) corresponding to a bit in the main data Da(n) unchanged when there is a bit inversion between consecutive ones of the main data Da(n), but inverts a sub-data bit Db(n) corresponding to a main data bit Da(n) when there is no bit inversion in the main data Da(n).

Figures 3, 4:
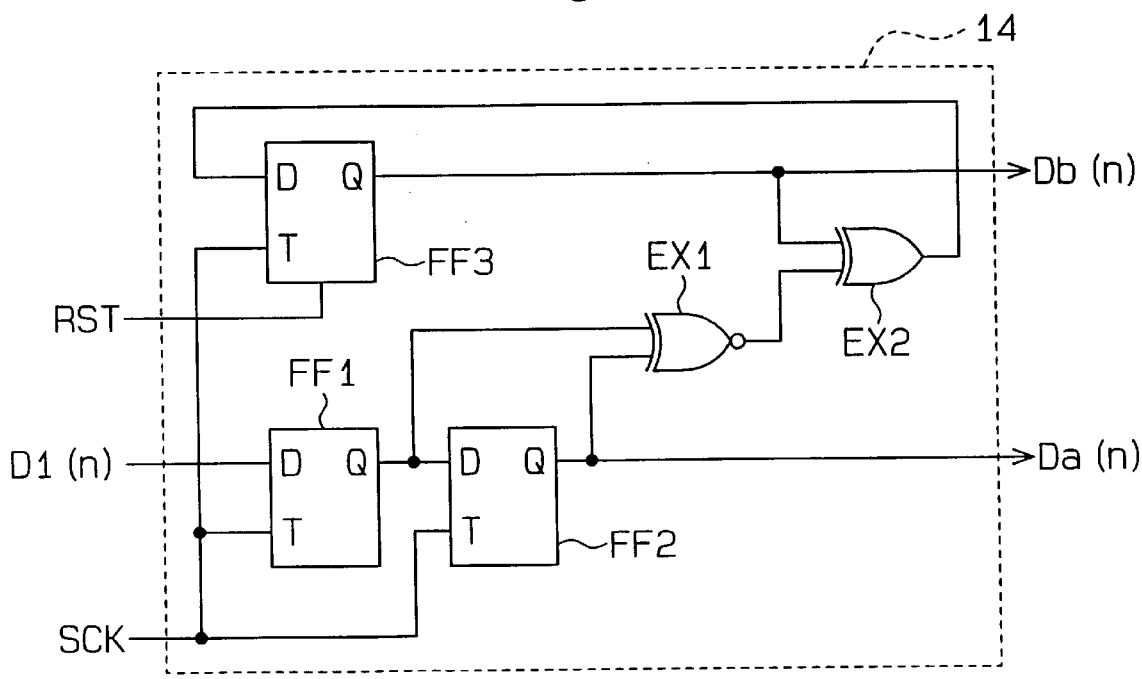
FIG. 3 is a chart showing an example of changes occurring in digital output signals appearing in the signal processing system of FIG. 2.
FIG. 4 is a circuit diagram of a complementary data producing circuit in the signal processing system of FIG. 2.

The complementary data generating circuit 14 produces the main data Da(n) having four bits, for example, and the sub-data Db(n) having four bits corresponding to the bits in the main data Da(n), as shown in FIG. 3. Whenever there is an inversion between corresponding bits in consecutive ones of the main data Da(n) (from "0" to "1" or from "1" to "0"), the corresponding bit in the sub-data Db(n) is maintained unchanged from the condition of the immediately preceding the sub-data Db(n−1). On the other hand, when there is no inversion the corresponding bits in consecutive ones of the main data Da(n), the corresponding bit in the sub-data Db(n) is formed by inverting the bit status of the immediately preceding sub-data Db(n−1) (from "0" to "1" or from "1" to "0"). In this manner, the main data Da(n) and the sub-data Db(n) are complementary to each other. Consequently, a sum of the number of the inverted bits in the main data Da(n) and the number of the inverted bits in the sub-data Db(n) is always equal to four when the data comprises four bits.

The first and second output circuits 15 and 16 are constructed in substantially the same manner, and each include a number of buffers, not shown, depending on the number of bits of main data Da(n) and sub-data Db(n) and are arranged in a known manner. Accordingly, a sum of the number of the inverted bits in the main data Da(n) from the first output circuit 15 and the number of the inverted bits in the sub-data Db(n) from the second output circuit 16 is maintained constant. Accordingly, a total sum of the currents flowing via the respective output circuits 15 and 16 or buffers as the data is changed is maintained constant independent of from the content of the main data Da(n).

The output circuits 15 and 16 are integrated together with the analog processing circuit 11 and the A/D converter 12 on the same semiconductor substrate. A fluctuation in the potential of the power supply can be reduced by maintaining the current dissipation constant as the data Da(n), Db(n) is changed. Accordingly, the generation of noise in the digital processing circuit 13 is reduced, which enables stabilized processing operations in the analog processing circuit 11.

The complementary data generating circuit 14 will now be described in detail with reference to FIG. 4. It is assumed for the purpose of the present description that the complementary data generating circuit 14 produces the main data Da(n) and sub-data Db(n) each having a single bit.

The complementary data generating circuit 14 comprises three D-type flip-flops FF1 to FF3 and a pair of exclusive OR gates EX1 and EX2. The first and second D-type flip-flops FF1 and FF2 form a two stage shift register, and are driven by a common clock signal SCK. The first D-type flip-flop FF1 receives the second digital data D1(n) at its D input terminal and delivers the second digital data D1(n) which is delayed by one clock to the second D-type flip-flop FF2 from its Q output terminal. The second D-type flip-flop FF2 receives the second digital data D1(n) from the first D-type flip-flop FF1 at its D input terminal, and delivers the main data Da(n) from its Q output terminal. The third D-type flip-flop FF3 is driven by the clock signal SCK which is common to the first and second D-type flip-flops FF1 and FF2. The third D-type flip-flop FF3 receives an output signal from the second exclusive OR gate EX2 at its D input terminal, and delivers the sub-data Db(n) from its Q output terminal. The third D-type flip-flop FF3 has a direct reset terminal, and thus can be reset in response to a reset signal RST from an external circuit. The output signal from the third D-type flip-flop FF3 or sub-data Db(n) is set to either "1" or "0" in response to the reset signal RST. In the present example, the sub-data Db(n) is set to "0".

The first exclusive OR gate EX1 is a not exclusive OR gate and has first and second input terminals which are connected to the Q output terminals of the first and second D-type flip-flops FF1 and FF2, respectively, and a single output terminal. The second exclusive OR gate EX2 has a first input terminal connected to the output terminal of the first exclusive OR gate EX1, a second input terminal connected to the Q output terminal of the third D-type flip-flop FF3 and an output terminal connected to the D input terminal of the third D-type flip-flop FF3.

Figure 5:
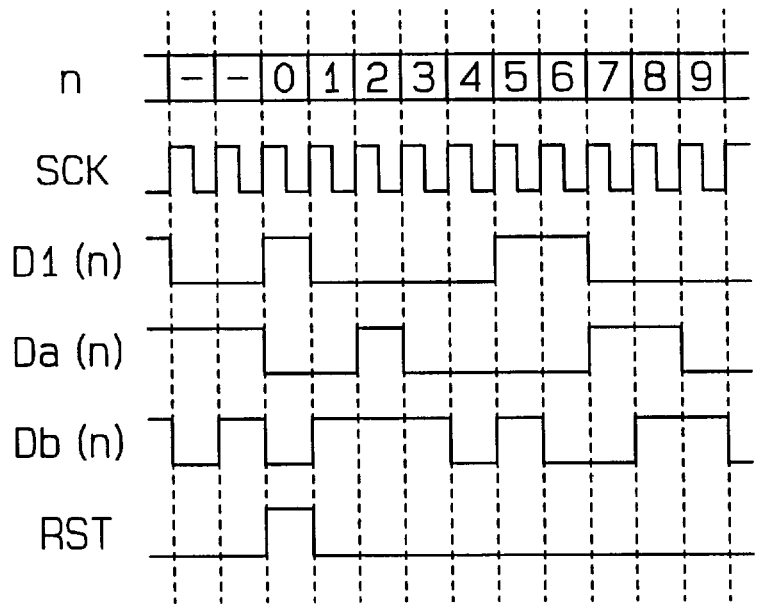
FIG. 5 is a timing chart illustrating the operation of the complementary data producing circuit of FIG. 4.

Referring to FIG. 5, the operation of the complementary data generating circuit 14 will now described with reference to a first bit in the main data Da(n) and sub-data Db(n). In FIG. 5, a high level is denoted by "1" and a low level is denoted by "0" for each signal.

The digital data D1(n) is passed via the two stage shift register delivered as the main data Da(n) from the Q output of the second D-type flip-flop FF2. Accordingly, the main data Da(n) has a waveform which is equivalent to the waveform of the digital data D1(n) delayed by two periods of the clock signals SCK. The digital data D1(n) is equivalent to the main data Da(n+2) and the Q output from the first D-type flip-flop is equivalent to the main data Da(n+1). When the Q outputs from the first and second D-type flip-flops FF1 and FF2 have values which are distinct from each other, the first exclusive OR gate EX1 delivers "0". In other words, when the digital data D1(n−1) and main data Da(n) have mutually distinct values or when the value of the digital data D1(n) has changed, the first exclusive OR gate EX1 delivers "0". When the output from the first exclusive OR gate EX1 and the Q output from the third D-type flip-flop FF3 have mutually distinct values, the second exclusive OR gate EX2 deliver "1".

For n=0, the third D-type flip-flop FF3 is reset in response to the rising edge of the reset signal RST, thereby establishing an initial value for the sub-data Db(n) to be "0". At this time, the digital data D1(n−1) is equal to "0" as is the main data Da(n). Accordingly, the first exclusive OR gate EX1 receives "0" at both of its inputs and delivers "1". The second exclusive OR gate EX2 then receives "1" from the first exclusive OR gate EX1 and receives "0" from the third D-type flip-flop FF3, thus delivering "1".

For n=1, the output "1" from the second exclusive OR gate EX2 for n=0 is delivered via the third D-type flip-flop FF3 as the sub-data Db(n). At this time, the first exclusive OR gate EX1 delivers "0" since the current main data Da(n) is equal to "0" and the next main data Da(n) is equal to "1". The second exclusive OR gate EX2 receives "0" from the first exclusive OR gate EX1 and receives "1" from the third D-type flip-flop FF3, and thus delivers "1".

For n=2, the output "1" from the second exclusive OR gate EX2 for n=1 is delivered via the third D-type flip-flop FF3 as the sub-data Db(n) of "1". In this manner, when the current main data Da(n) is the same as the preceding main data Da(n−1), the sub-data Db(n) is inverted. When the current main data Da(n) is distinct from the preceding main data Da(n−1), the sub-data Db(n) is not changed. That is, it is maintained equal to the preceding sub-data Db(n−1). Accordingly, when each of the main data Da(n) and the sub-data Db(n) comprises a single bit, only one of either the main data Da(n) or the sub-data Db(n) is inverted for each cycle of the clock signal SCK or each time the digital data D1(n) is renewed.

While the above description illustrates the operation when the main data Da(n) and the sub-data Db(n) in which both comprise a single bit, each of data Da(n) and Db(n) may comprise multiple bits. In such instance, a number of complementary data generating circuits 14 which depends on the number of bits in such data are connected in parallel. The third flip-flop FF3 may receive the main data Da(n) instead of establishing an initial value of sub-data Db(n) to be "0" in response to the reset signal RST. In this instance, the initial value of the sub-data Db(n) coincides with the initial value of the main data Da(n).

Figure 6:
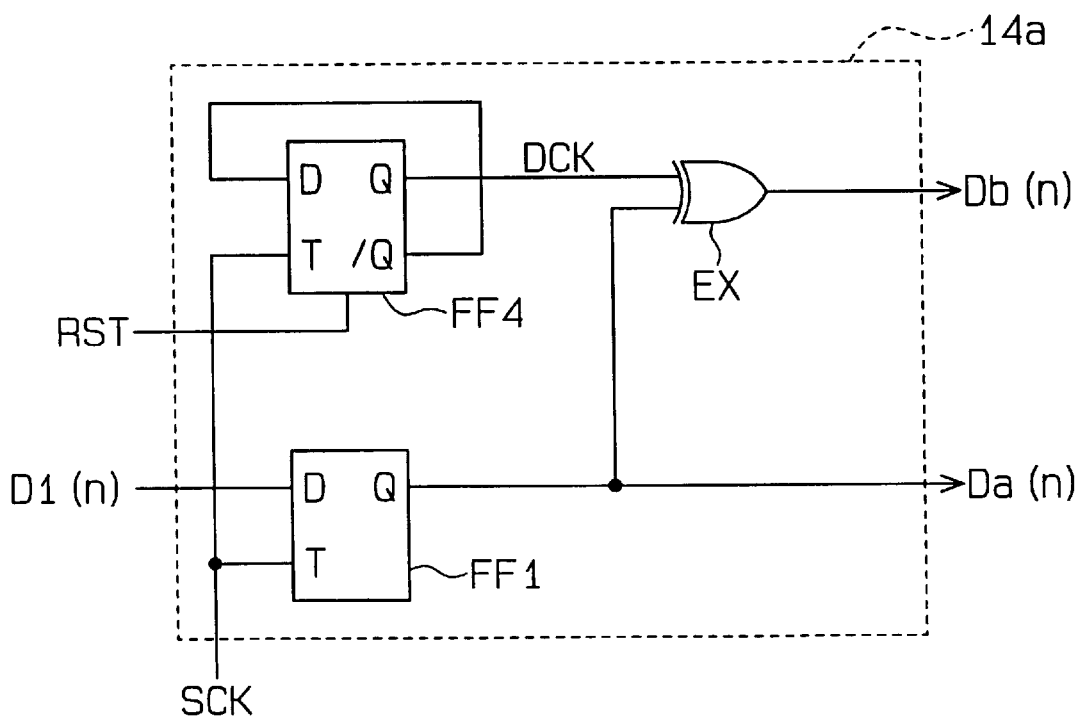
FIG. 6 is a circuit diagram of another form of complementary data producing circuit.
Figure 7:
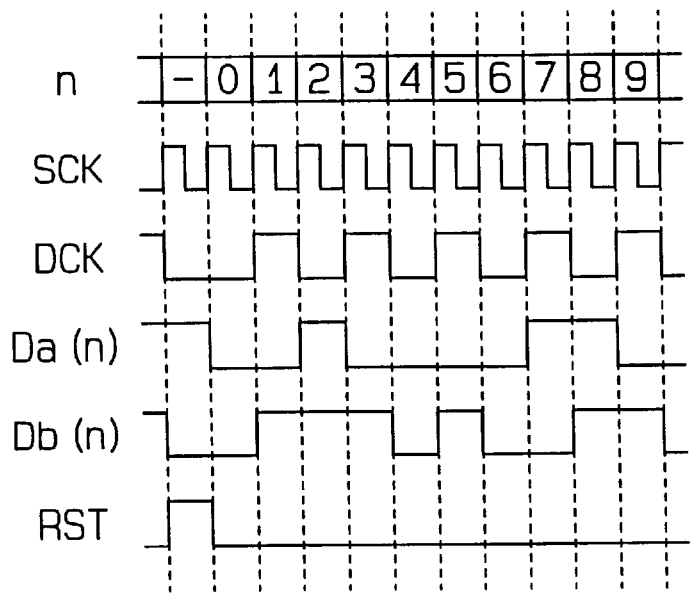
FIG. 7 is a timing chart illustrating the operation of the complementary data producing circuit of FIG. 6.

Another form of complementary data generating circuit 14a will now be described with reference to FIGS. 6 and 7, which are a circuit diagram of the complementary data generating circuit 14a and a timing chart illustrating the operation thereof. As before, it is assumed in these Figures that each of the main data Da(n) and the sub-data Db(n) comprises a single bit.

The complementary data generating circuit 14a comprises first and fourth D-type flip-flops FF1 and FF4 and a single exclusive OR circuit EX. The first and fourth flip-flops FF1 and FF4 are driven by a clock signal SCK having a constant period. The first flip-flop FF1 receives the digital data D1(n)

at its D input terminal, and delivers the digital data D1(n) as the main data Da(n) from its Q output at a timing which conforms to the clock signal SCK. The fourth flip-flop FF4 forms a single bit counter, and receives an inverted output /Q at its D input terminal. The fourth flip-flop FF4 delivers a clock signal DCK, which is formed by a frequency demultiplication of the clock signal SCK by a factor of 2, from its Q output terminal. The fourth flip-flop FF4 is reset to "0" in response to the reset pulse which rises during initialization.

The exclusive OR circuit EX has a pair of input terminals which are connected to the Q output terminal of the first flip-flop FF1 and Q output terminal of the fourth flip-flop FF4, respectively, and a single output terminal. The exclusive OR circuit EX receives the Q outputs from the first and fourth flip-flops FF1 and FF4, and delivers an exclusive OR of these outputs as the sub-data Db(n). When the frequency demultiplied clock signal DCK is low or when n=2k where k=0,1,2, . . . , the exclusive OR circuit EX delivers the main data Da(n) directly as the sub-data Db(n). When the frequency demultipled clock signal DCK assumes a high level or when n=2k+1 where k=0,1,2, . . . , the exclusive OR circuit EX delivers an inversion of the main data Da(n) as the sub-data Db(n). As a consequence, either one of the main data Da(n) and sub-data Db(n) is inverted for each cycle of the clock signal SCK. Where each of the main data Da(n) and the sub-data Db(n) comprises multiple bits, a number of complementary data generating circuits 14a, which depends on the number of bits, may be connected in parallel.

A receiver circuit 100 which recovers the original digital data D1(n) from the main data Da(n) and the sub-data Db(n) will now be described with reference to FIGS. 8 and 9. In these Figures, it is assumed for the purpose of simplifying the illustration that each of the main data Da(n) and sub-data Db(n) comprises a single bit.

Figure 8:
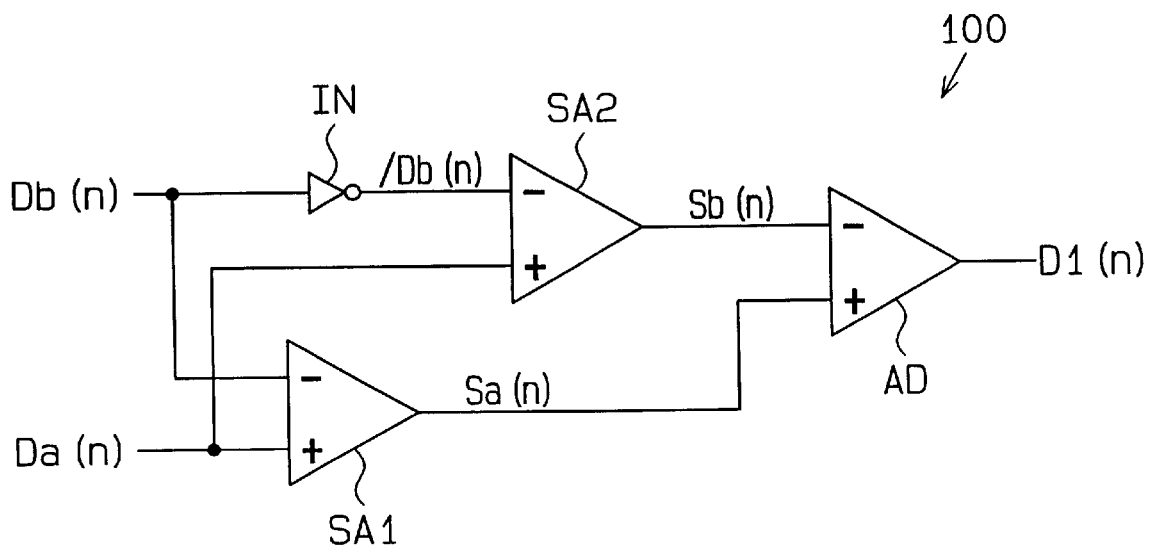
FIG. 8 is a schematic block diagram of a receiver circuit which receives data from the signal processing system.

Referring to FIG. 8, the receiver circuit 100 comprises first and second differential amplifiers SA1 and SA2, each capable of an analog operation, a summer AD and an inverter IN. The first differential amplifier SA1 has a non-inverting input terminal for receiving the main data Da(n), an inverting input terminal for receiving the sub-data Db(n), and an output terminal for delivering an output Sa(n) to the summer AD. The second differential amplifier SA2 has a non-inverting input terminal at which it receives the main data Da(n), an inverting input terminal at which it receives an inverted data /Db(n) via the inverter IN, and an output terminal which delivers an output Sb(n) to the summer AD. The summer AD has a pair of input terminals at which it receives the outputs Sa(n) and Sb(n) from the first and the second differential amplifier SA1 and SA2, respectively, and an output terminal which delivers a recovered digital data D1(n).

Referring to FIG. 9, when the main data Da(n) assumes a higher level than the sub-data Db(n), the first differential amplifier SA1 delivers Sa(n)-high. In contrast, when the main data Da(n) assumes a lower level than the sub-data Db(n), the first differential amplifier SA1 delivers Sa(n)-low. When the main data Da(n) and the sub-data Db(n) assumes an equal level, the first differential amplifier SA1 delivers Sa(n)-middle. When n is an even number, the output Sa(n) has an intermediate level.

On the other hand, when the main data Da(n) assumes a higher level than the inverted data /Db(n), the second differential amplifier SA2 delivers Sa(n)-high. In contrast, when the main data Da(n) assumes a lower level than the inverted data /Db(n), the second differential amplifier SA2 delivers Sa(n)-low. When both of the main data Da(n) and the inverted data /Db(n) assume an equal level, the second differential amplifier SA2 delivers Sa(n) of an intermediate level. When n is an odd number, the output Sb(n) has an intermediate level. Original digital data D1(n) is recovered by summing the outputs Sa(n) and Sb(n) together. Specifically, when the output Sa(n) assumes an intermediate level, corresponding output Sb(n)-high or -low will be delivered as D1(n). When the output Sb(n) has an intermediate level, a corresponding output Sa(n)-high or -low will be delivered as D1(n).

With the described receiver circuit 100, if the main data Da(n) and the sub-data Db(n) have a reduced amplitude, the digital data D1(n) can be reliably recovered provided that a comparing operation by each differential amplifier SA1 or SA2 is enabled. In such instance, the power dissipation of the receiver circuit 100 is reduced as a result of the reduced amplitude of the data Da(n) and Db(n). Where each of the main data Da(n) and sub-data Db(n) comprises multiple bits, a number of receiver circuits 100 which depends on the number of bits are connected in parallel.

The present examples and embodiments are to be considered as illustrative and not restrictive and the invention is not to be limited to the details given herein, but may be modified within the scope and equivalence of the appended claims.

What is claimed is:

1. A signal processing system comprising:
   an analog processing circuit for perfoming a predetermined signal processing operation on an analog input signal;
   an A/D converter connected to the analog signal processing circuit for receiving a processed analog signal from the analog signal processing circuit and for converting the processed analog signal into at least one digital data having at least one bit;
   a complementary data generating circuit for receiving the digital data from the A/D converter and for producing sub-data containing at least one bit which is mutually complementary to the digital data, the complementary data generating circuit being operative whenever there is a change in at least one bit between consecutive bits of the digital data to maintain the status of a corresponding bit in the sub-data unchanged, and whenever there is no change in at least one bit between consecutive bits of the digital data to invert a corresponding bit in the sub-data;
   a first output circuit connected to the complementary data generating circuit for delivering the digital data; and
   a second output circuit connected to the complementary data generating circuit for delivering the sub-data.

2. The signal processing system according to claim 1, wherein the complementary data generating circuit produces the sub-data by repeating an inversion or non-inversion for every consecutive bit of the digital data.

3. The signal processing system according to claim 1, further comprising a digital signal processing circuit connected between the A/D converter and the complementary data generating circuit for receiving digital data produced from the A/D converter, performing a signal processing operation on the digital data, and providing the processed digital data to the complementary data generating circuit.

4. The signal processing system according to claim 1, wherein the first and second output circuits are constructed substantially in an identical circuit arrangement.

5. The signal processing system according to claim 1, wherein the complementary data generating circuit comprises:

a first flip-flop circuit having a D input terminal for receiving the digital data from the A/D converter and a Q output terminal;

a second flip-flop circuit having a D input terminal connected to the Q output terminal of the first flip-flop circuit and a Q output terminal;

a first exclusive OR gate having first and second input terminals connected to the Q output terminals of the first and second flip-flop circuits, respectively, and an output terminal;

a second exclusive OR gate having a first terminal connected to the output terminal of the first exclusive OR gate, a second input terminal and an output terminal; and a third flip-flop circuit having an input terminal for receiving a signal from the second exclusive OR gate and an output terminal connected to the second input terminal of the second exclusive OR gate and the second output circuit.

6. The signal processing system according to claim 1, wherein the complementary data generating circuit comprises:

a first flip-flop circuit having a D input terminal where it receives the digital data from the A/D converter and a Q output terminal;

a fourth flip-flop circuit having Q and /Q output terminals and a D input terminal connected to the /Q output terminal; and an exclusive OR gate having a first input terminal and a second input terminal connected to the Q output terminals of the first and second flip-flop circuits, respectively, and an output terminal connected to the second output circuit.

* * * * *